United States Patent
Lee et al.

(10) Patent No.: US 10,331,263 B2
(45) Date of Patent: Jun. 25, 2019

(54) OLED DISPLAY PANEL WITH TOUCH SENSING ELECTRODES

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 307 days.

(21) Appl. No.: 15/359,961

(22) Filed: Nov. 23, 2016

(65) Prior Publication Data

US 2018/0143729 A1   May 24, 2018

(51) Int. Cl.
  *G06F 3/041* (2006.01)
  *G06F 3/044* (2006.01)
  (Continued)

(52) U.S. Cl.
  CPC ............ *G06F 3/0416* (2013.01); *G06F 3/044* (2013.01); *G06F 3/0412* (2013.01); *H01L 27/323* (2013.01); *H01L 27/3262* (2013.01); *H01L 51/5253* (2013.01); *G06F 2203/04107* (2013.01); *G06F 2203/04111* (2013.01); *G06F 2203/04112* (2013.01)

(58) Field of Classification Search
  CPC . G06F 2203/04107; G06F 2203/04111; G06F 2203/04112; G06F 3/0412; G06F 3/0416; G06F 3/044; H01L 27/323; H01L 51/5237
  See application file for complete search history.

(56) References Cited

U.S. PATENT DOCUMENTS

2014/0016043 A1* 1/2014 Chen ..................... G06F 3/041
  349/12
2014/0253502 A1* 9/2014 Cho ..................... G06F 3/0412
  345/174

(Continued)

FOREIGN PATENT DOCUMENTS

| TW | M502897 U | 6/2015 |
| TW | M506318 U | 8/2015 |
| TW | 201621594 A | 6/2016 |

*Primary Examiner* — Viet D Pham
(74) *Attorney, Agent, or Firm* — Muncy, Geissler, Olds & Lowe, P.C.

(57) ABSTRACT

An OLED display panel includes a common electrode layer, a display pixel electrode and touch sensing electrode layer, an OLED layer, a lower substrate, a thin film transistor layer, and an encapsulation layer. The common electrode layer has plural through holes defined therein. The display pixel electrode and touch sensing electrode layer includes plural display pixel electrodes and plural touch sensing electrodes, wherein each touch sensing electrode has a mesh type pattern. The OLED layer is configured between the common electrode layer and the display pixel electrode and touch sensing electrode layer. The thin film transistor layer is disposed at one side of the lower substrate facing the OLED layer. The encapsulation layer is disposed at the other side of the common electrode layer facing the OLED layer. A first power circuit for the touch sensing electrodes is independent to a second power circuit for the OLED display panel.

16 Claims, 13 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 2014/0346493 A1* | 11/2014 | Lee | G06F 3/0412 |
| | | | 257/40 |
| 2015/0035787 A1* | 2/2015 | Shahparnia | G06F 3/044 |
| | | | 345/174 |
| 2015/0042612 A1* | 2/2015 | Lee | G02F 1/13338 |
| | | | 345/174 |
| 2015/0049264 A1* | 2/2015 | Lee | G02F 1/13338 |
| | | | 349/12 |
| 2015/0085206 A1* | 3/2015 | Lee | G02F 1/13338 |
| | | | 349/12 |
| 2015/0085208 A1* | 3/2015 | Lee | G06F 3/0412 |
| | | | 349/12 |
| 2016/0048241 A1* | 2/2016 | Zhao | G06F 3/0412 |
| | | | 345/174 |
| 2016/0162075 A1* | 6/2016 | Lee | G06F 3/044 |
| | | | 345/174 |
| 2016/0274716 A1* | 9/2016 | Liu | G02F 1/133345 |
| 2017/0033323 A1* | 2/2017 | Chida | H01L 51/0097 |

* cited by examiner

OLED DISPLAY PANEL WITH TOUCH SENSING ELECTRODES

BACKGROUND OF THE INVENTION

1. Field of the Invention

The present invention relates to a touch display panel and, more particularly, to an organic light emitting diode (OLED) display panel with touch sensing electrodes.

2. Description of Related Art

In recent year, the flat panel display industry has been rapidly developed, and many products have also been made in pursuit of light weight, thinness, small volume and fine image quality for developing several types of flat panel displays to replace traditional cathode ray tube display (CRT). The flat panel display includes liquid crystal display (LCD), plasma display panel (PDP), organic light emitting diode (OLED) display, field emission display (FED), and vacuum fluorescence display (VFD).

Among these types of flat panel displays, the OLED display technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD. In recent years, due to the development of mobile communications, digital products and digital televisions, the demand for high-quality full-color flat panel displays is rapidly increased. The OLED display is provided with not only the advantages of LCD display including thinness, power-saving, and full-color display, but also the features of wide viewing angle, self-illumination, and fast response that are better than LCD.

Modern consumer electronic apparatuses are typically equipped with touch panels for use as their input devices. The principle of touch panels is based on different sensing manners to detect a voltage, current, acoustic wave, or infrared to thereby detect the coordinates of touch points on a screen where a finger or touch pen touches. For example, a capacitive touch panel uses a capacitance change generated in an electrostatic combination of the arranged transparent electrodes with a human body to generate a current or voltage for detecting touch coordinates. With the widespread use of smart phones, the multi-touch technique is getting more and more important. Currently, the multi-touch is typically implemented by projected capacitive touch technique.

Figure 1:
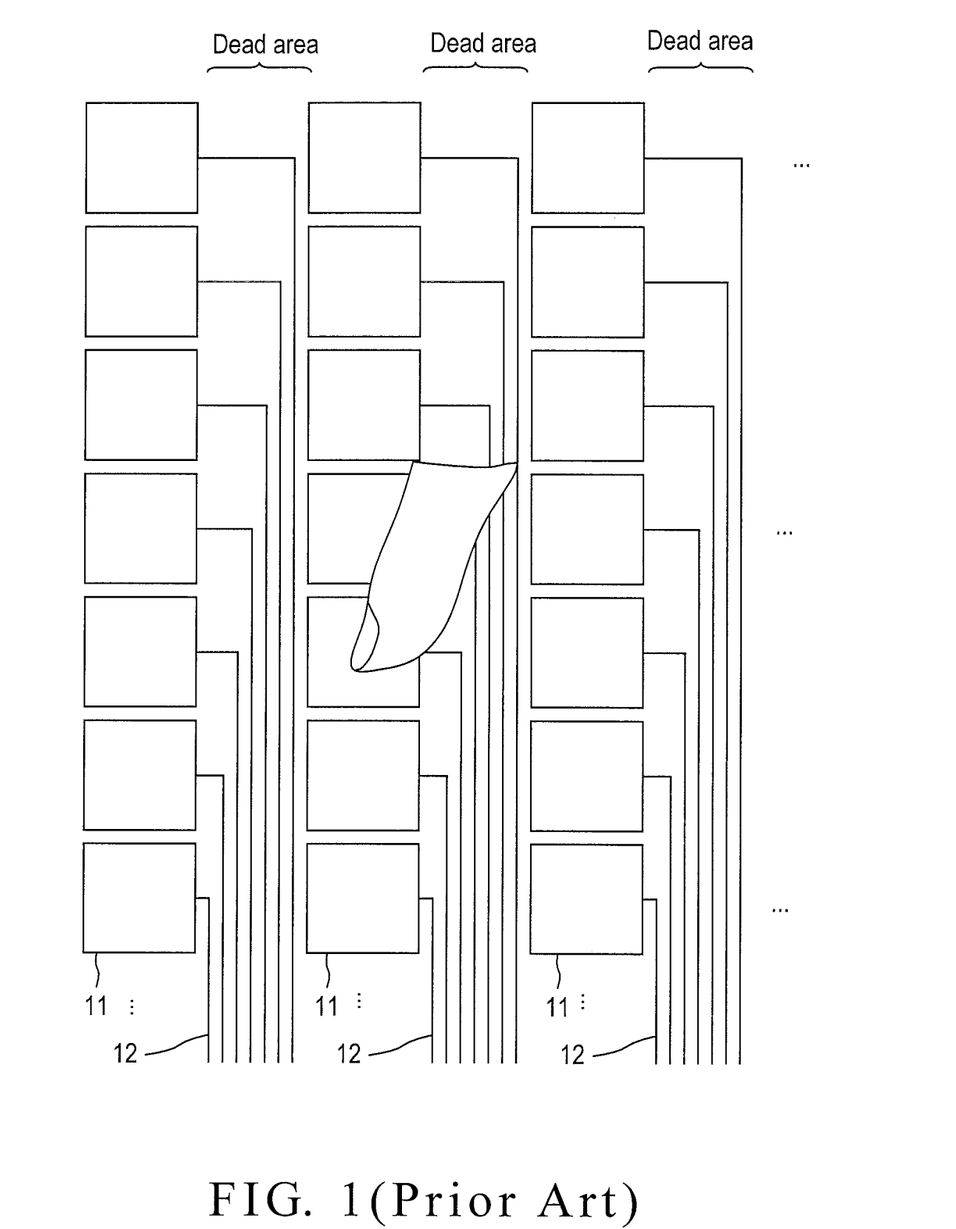
FIG. 1 schematically illustrates the transparent electrode structure of a single-layer touch panel of the self-capacitance touch sensing technique.

The projected capacitive touch technique can be divided into the mutual-capacitance touch sensing technique and the self-capacitance touch sensing technique. FIG. 1 schematically illustrates the transparent electrode structure of a single-layer touch panel of the self-capacitance touch sensing technique. As shown, there are a plurality of transparent electrodes 11 arranged in rows and columns, and the electrical signal sensed by one transparent electrode 11 is transmitted through a corresponding conductive wire 12 for output. Such a single-layer transparent electrode structure can realize an actual multi-touch detection. In use, the single-layer transparent electrode structure of FIG. 1 is combined with a display panel. However, when the single-layer transparent electrode structure is integrated to the inside of a display panel, there will be an obvious capacitance produced between the single-layer transparent electrode structure and a common voltage (Vcom) layer of the display panel, which may cause noises to be produced and thus lower the accuracy in detection the touch position. Therefore, it is known that the touch control circuit, particularly the touch control circuit of the in-cell touch panel, is highly susceptible to noises. The conductive wire 12 is used to transmit the electrical signal sensed by the transparent electrode 11, and thus the area of the conductive wire 12 cannot be used to sense the variation of capacitance, resulting in a dead area for the touch detection. Moreover, the common voltage (Vcom) layer of the display panel will form a shielding layer for external object, i.e. the user's finger, and it is difficult to integrate the in-cell self-capacitance touch sensing technique into the OLED display.

Therefore, it is desirable to provide an OLED display panel with touch sensing electrodes to mitigate and/or obviate the aforementioned problems.

SUMMARY OF THE INVENTION

The object of the present invention is to provide an OLED display panel with touch sensing electrodes capable of significantly increasing the yield rate for integration of the in-cell self-capacitance touch sensing technique into the OLED display, and accurately detecting the touch position, so as to be more suitable for the design of touch panel of OLED display in comparison with the prior art.

To achieve the object, there is provided an OLED display panel with touch sensing electrodes, which includes: a common electrode layer having a plurality of through holes defined therein; a display pixel electrode and touch sensing electrode layer including a plurality of display pixel electrodes and a plurality of touch sensing electrodes, wherein each touch sensing electrode has a mesh type pattern; an OLED layer configured between the common electrode layer and the display pixel electrode and touch sensing electrode layer; a lower substrate; a thin film transistor layer disposed at one side of the lower substrate facing the OLED layer; and an encapsulation layer disposed at the other side of the common electrode layer facing the OLED layer, wherein a first power circuit for the touch sensing electrodes is independent to a second power circuit for the OLED display panel.

DETAILED DESCRIPTION OF THE PREFERRED EMBODIMENT

Figure 2:
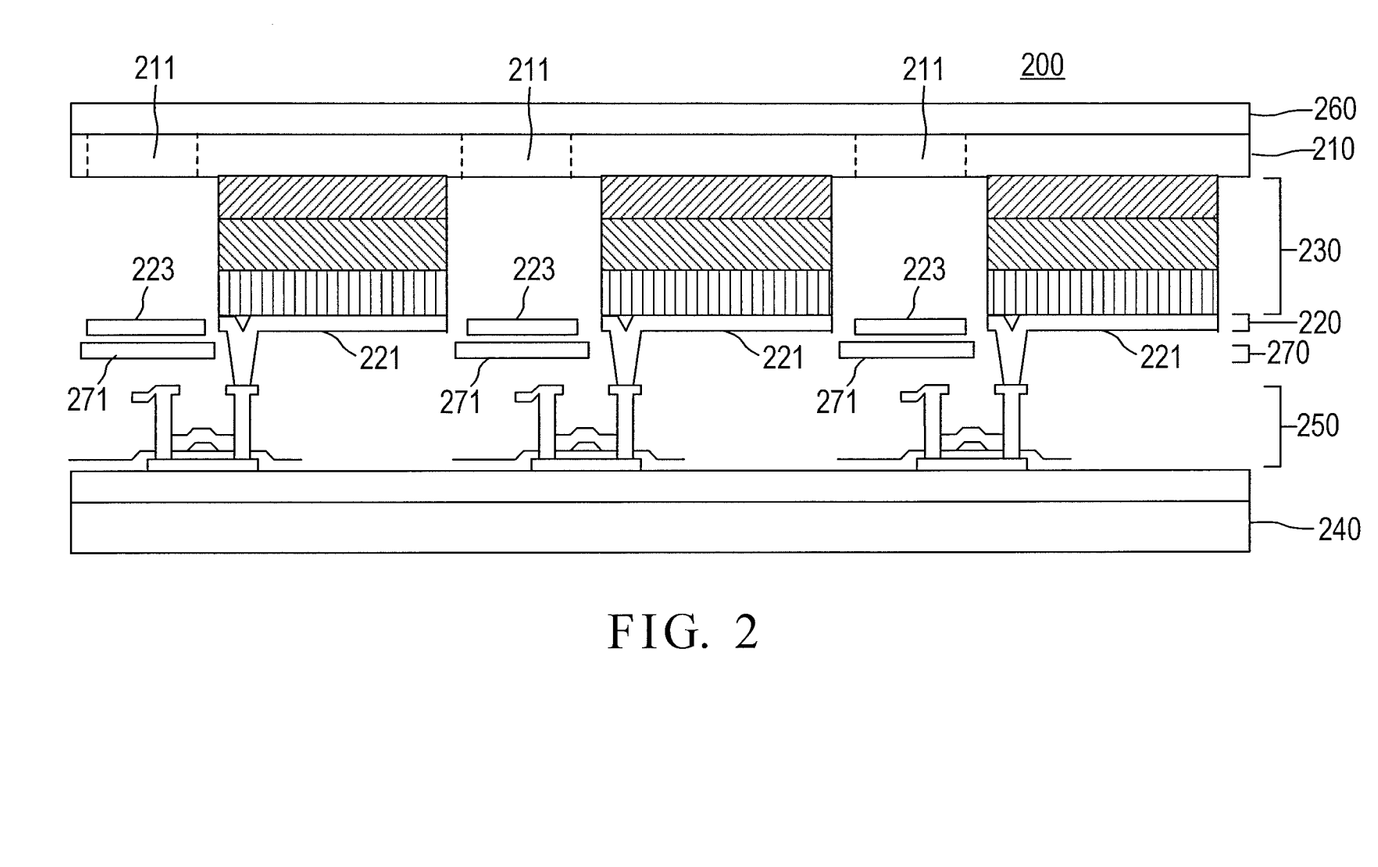
FIG. 2 is a first stackup diagram of the OLED display panel with touch sensing electrodes in accordance with the present invention.

FIG. 2 is a stackup diagram of the OLED display panel with touch sensing electrodes in accordance with a first embodiment of the present invention. As shown, the OLED display panel with touch sensing electrodes 200 includes a common electrode layer 210, a display pixel electrode and touch sensing electrode layer 220, an OLED layer 230, a lower substrate 240, a thin film transistor layer 250, an encapsulation layer 260, and a first reflection shielding electrode layer 270.

The common electrode layer 210 has a plurality of through holes 211 defined therein.

The display pixel electrode and touch sensing electrode layer 220 includes a plurality of display pixel electrodes 221 and a plurality of touch sensing electrodes 223, wherein each touch sensing electrode 223 has a mesh type pattern.

The OLED layer 230 is configured between the common electrode layer 210 and the display pixel electrode and touch sensing electrode layer 220.

The thin film transistor layer 250 is disposed at one side of the lower substrate 240 facing the OLED layer 230.

The encapsulation layer 260 is disposed at the other side of the common electrode layer 210 facing the OLED layer 230. The encapsulation layer 260 can be used as an upper substrate.

The first reflection shielding electrode layer 270 is configured between the display pixel electrode and touch sensing electrode layer 220 and the lower substrate 240, and the first reflection shielding electrode layer 270 has at least one reflection shielding electrode 271.

Figure 3:
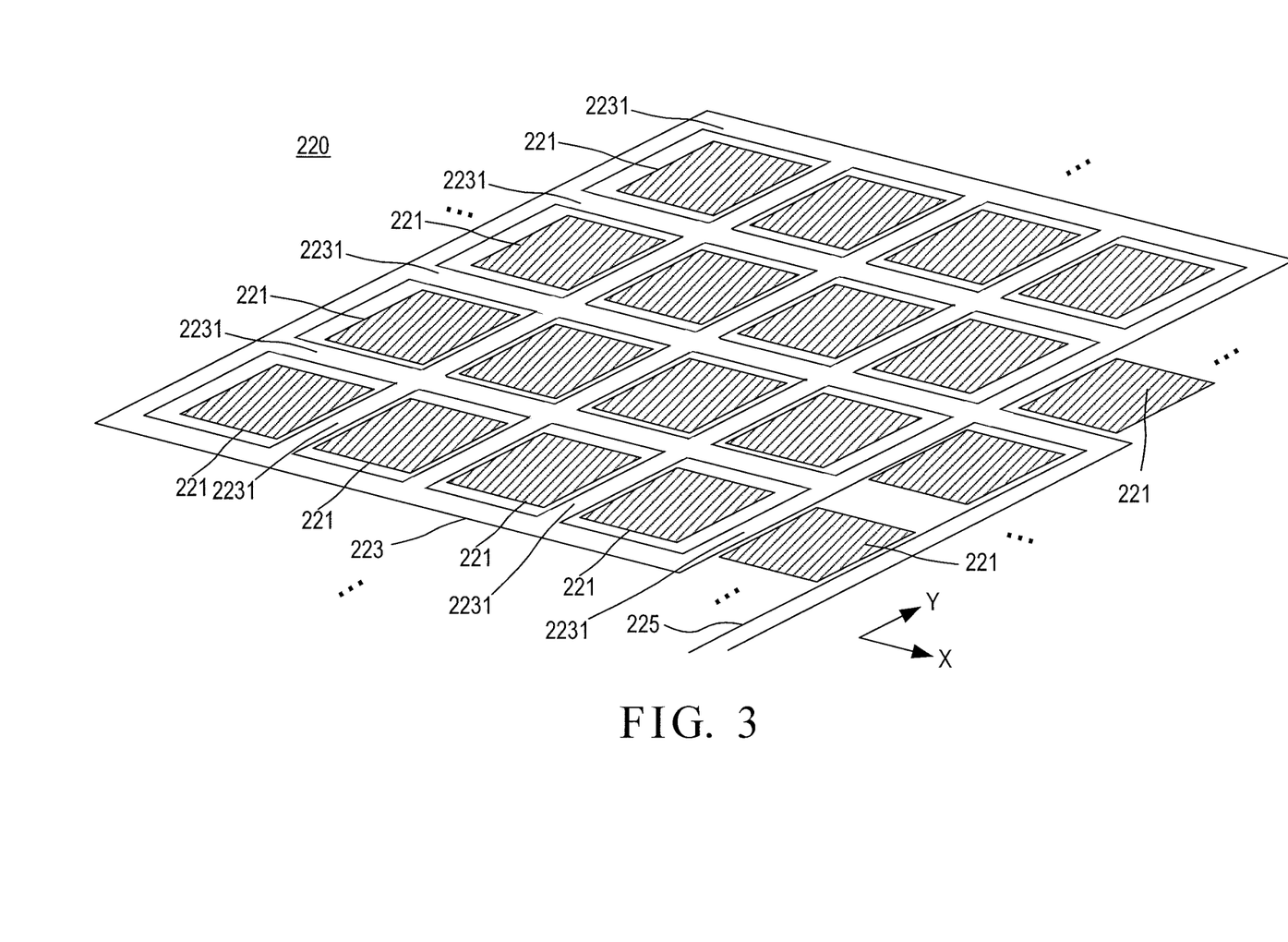
FIG. 3 is a schematic diagram of the touch sensing electrode and the display pixel electrodes in accordance with an example of the present invention.

FIG. 3 is a schematic diagram of the touch sensing electrode 223 and the display pixel electrodes 221 in accordance with an example of the present invention. As shown, the touch sensing electrode 223 has a mesh type pattern, wherein there are sixteen display pixel electrodes 221 surrounded by the touch sensing electrode 223. The number of the display pixel electrodes 221 surrounded by the touch sensing electrode 223 is provided for illustrative purpose only, but not for limitation. The touch sensing electrode 223 is composed of a plurality of conductor lines 2231. That is, the conductor lines 2231 of the same touch sensing electrode 223 are electrically connected to form the mesh type pattern.

The display pixel electrode and touch sensing electrode layer 220 is a transparent conductive layer made of transparent material selected from the group consisting of ITO, ZTO, IZO, conductive polymer, carbon nanotube, graphene, and silver film with a thickness smaller than 50 nanometers. The touch sensing electrode 223 is composed of a plurality of conductor lines 2231 made of the same material as the display pixel electrode 221. In other example, the conductor lines 2231 can be made of conductive material that is different from the material of the display pixel electrode 221.

Figure 4:
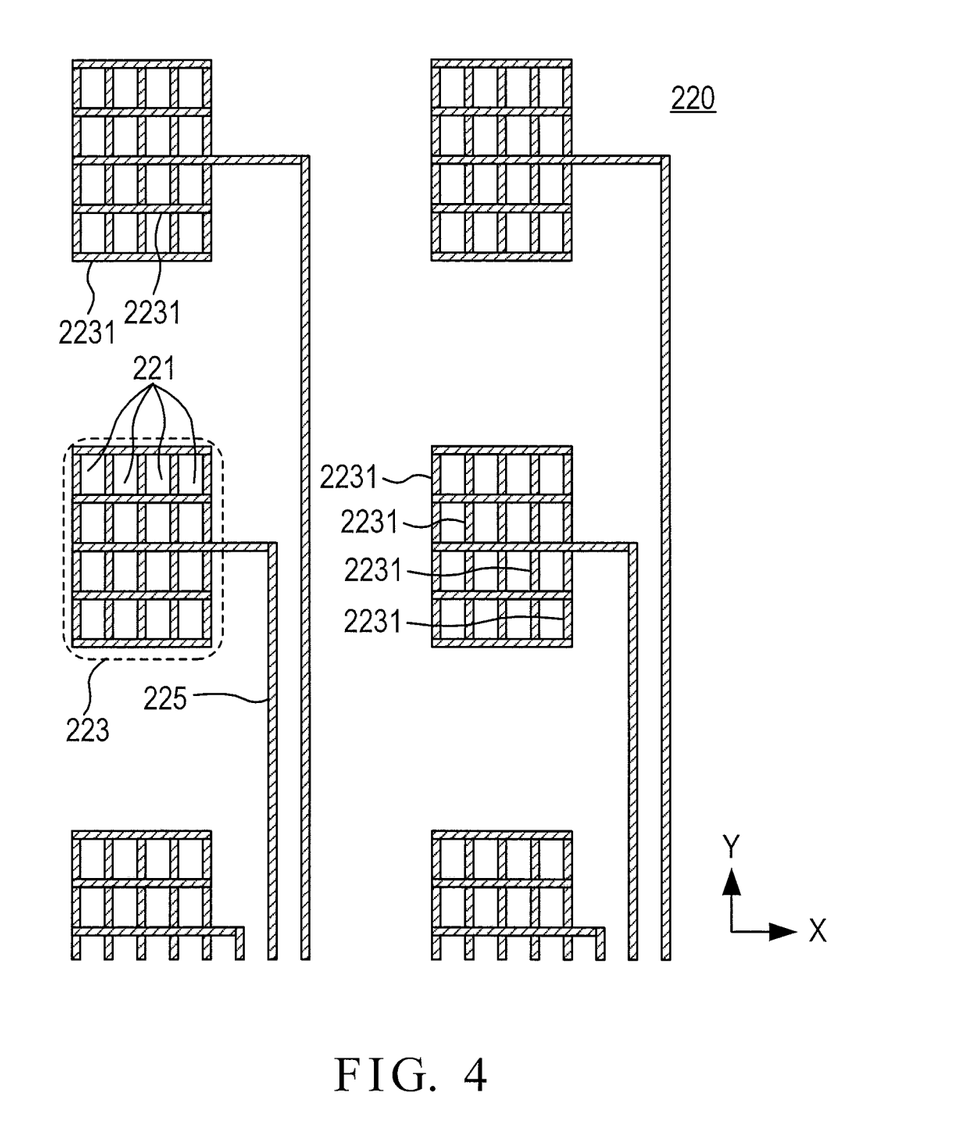
FIG. 4 is a schematic diagram of touch sensing electrode layer in accordance with an example of the present invention.

FIG. 4 is a schematic diagram of touch sensing electrode layer 220 in accordance with an example of the present invention. As shown, the display pixel electrode and touch sensing electrode layer 220 is composed of a plurality of display pixel electrodes 221, a plurality of touch sensing electrodes 223, and a plurality of signal paths 225. The plurality of conductor lines 2231 of the touch sensing electrodes 223 are arranged in a first direction (X-axis direction) and a second direction (Y-axis direction), wherein the first direction is perpendicular to the second direction.

In a touch detection period, a self-capacitance touch detection circuit (not shown) sequentially or randomly outputs a touch detection signal to the touch sensing electrode 223 and reads a touch sensing signal form the selected touch sensing electrode 223 by a corresponding signal path 225.

Figure 5:
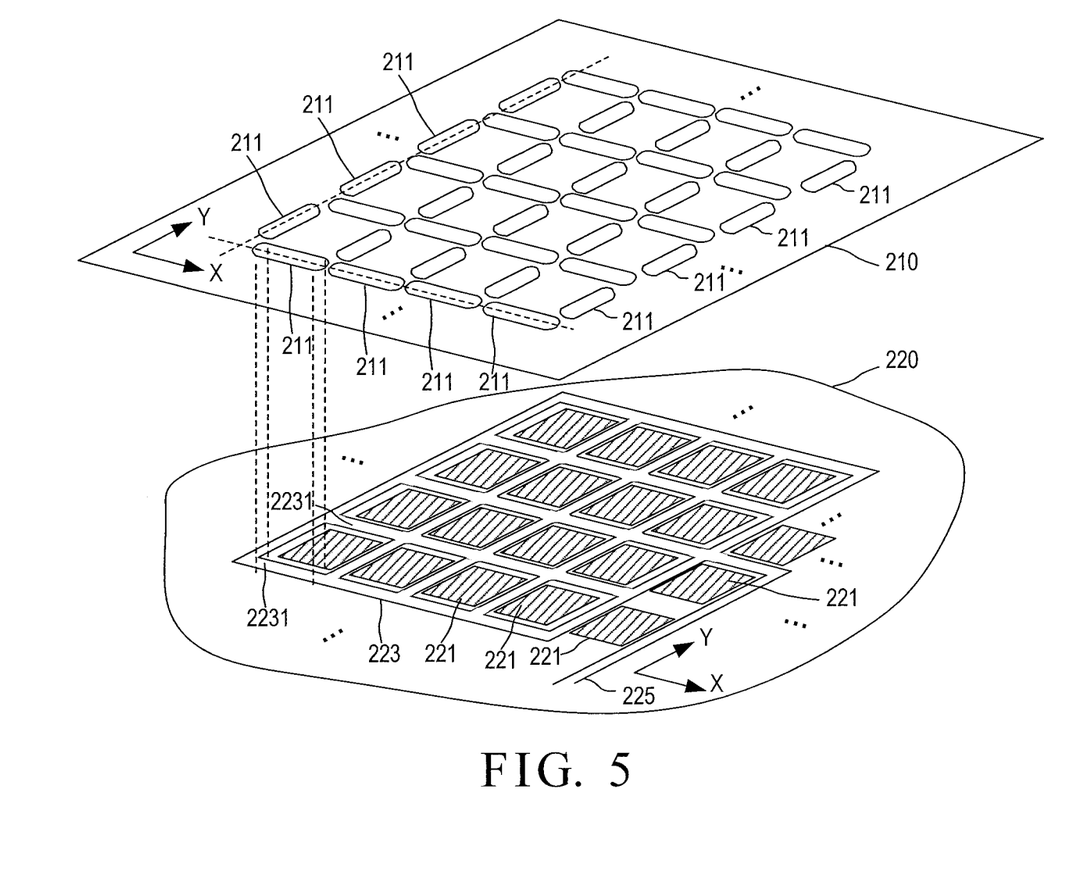
FIG. 5 is a schematic diagram of the common electrode layer and the display pixel electrode and touch sensing electrode layer in accordance with an example of the present invention.

FIG. 5 is a schematic diagram of the common electrode layer 210 and the display pixel electrode and touch sensing electrode layer 220 in accordance with an example of the present invention. As shown, the plurality of through holes 211 are disposed at positions corresponding to positions of touch sensing electrodes 223; i.e., each of through holes 211 is disposed at position corresponding to a position of conductor lines 2231 of the touch sensing electrodes 223. The electric flux lines emitting from the touch sensing electrodes 223 to a finger of a user will not be shielded by the common electrode layer 210. It can increase the electric flux lines between the touch sensing electrodes 223 and a finger of user. Therefore, it can accurately detect the touch position of the finger.

Moreover, for signal integrality, each of the through holes 211 is separated from the others, and the common electrode layer 210 can be regarded as a whole piece of electrical connection.

The common electrode layer 210 is a transparent silver film with a thickness smaller than 50 nanometers. In one example, the common electrode layer 210 is a cathode layer and the display pixel electrode 221 is an anode display pixel electrode. In another example, the common electrode layer 210 is an anode layer and the display pixel electrode 221 is a cathode display pixel electrode.

Figure 6:
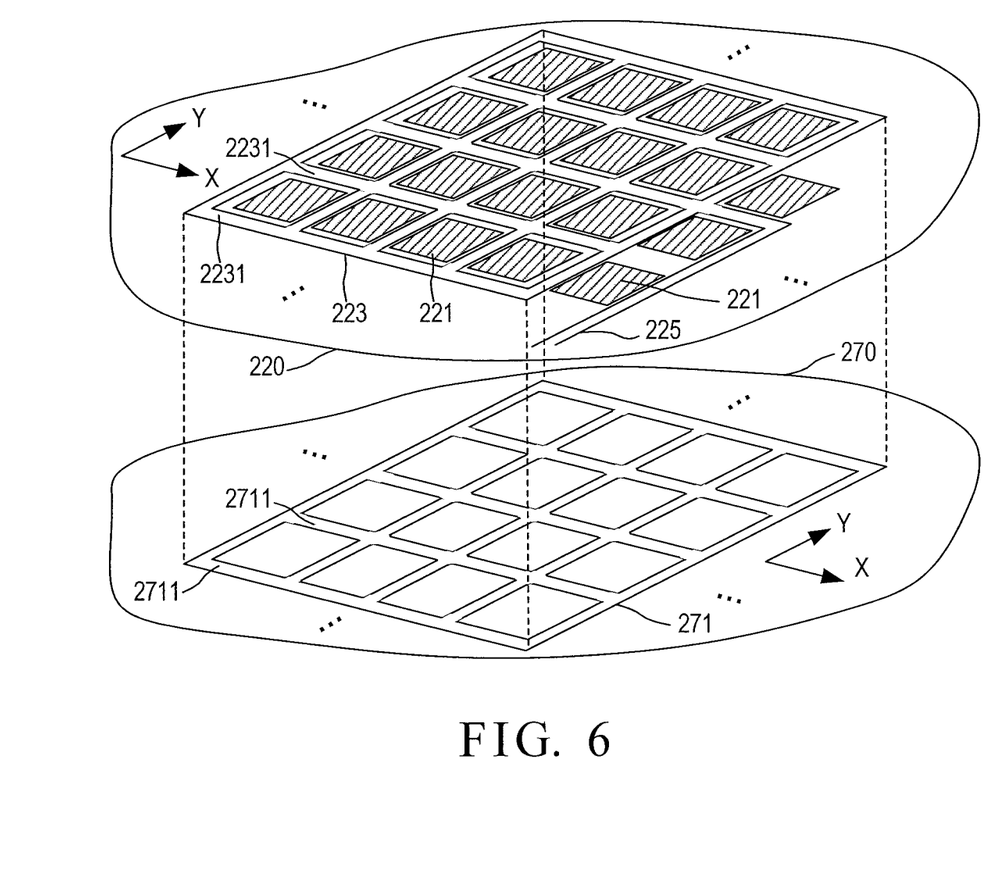
FIG. 6 is a schematic diagram of the display pixel electrode and touch sensing electrode layer and the first reflection shielding electrode layer in accordance with a first example of the present invention.

The first reflection shielding electrode layer 270 is made of transparent conductive material or opaque conductive material. FIG. 6 is a schematic diagram of the display pixel electrode and touch sensing electrode layer 220 and the first reflection shielding electrode layer 270 in accordance with an example of the present invention. As shown, the at least one reflection shielding electrode 271 has a mesh type pattern and is disposed at a position corresponding to a position of a touch sensing electrode 223.

As shown, the at least one reflection shielding electrode 271 is composed of a plurality of conductor lines 2711. That is, the conductor lines 2711 of the at least one reflection shielding electrode 271 are electrically connected together to form the mesh type pattern, and are arranged in the first direction (X-axis direction) and the second direction (Y-axis direction). The conductor lines 2711 are respectively disposed at positions corresponding to positions of the conductor lines 2231 of the touch sensing electrodes 223.

Figure 7:
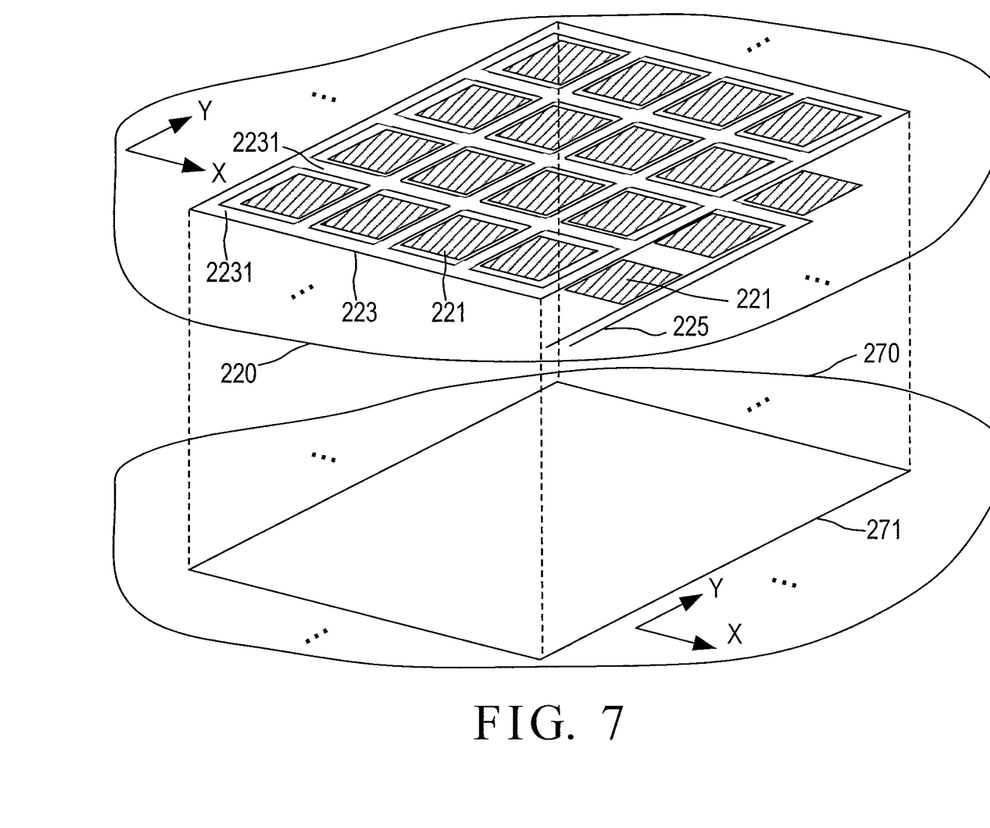
FIG. 7 is a schematic diagram of the display pixel electrode and touch sensing electrode layer and the first reflection shielding electrode layer in accordance with a second example of the present invention.

FIG. 7 is a schematic diagram of the display pixel electrode and touch sensing electrode layer 220 and the first reflection shielding electrode layer 270 in accordance with another example of the present invention. As shown, the at least one reflection shielding electrode 271 has a rectangle type pattern and is disposed at a position corresponding to a position of a touch sensing electrode 223.

In still another example, the first reflection shielding electrode layer 270 may only have one reflection shielding electrode 271 and the only one reflection shielding electrode 271 may make up the first reflection shielding electrode layer 270 and occupy the whole first reflection shielding electrode layer 270.

Figure 8:
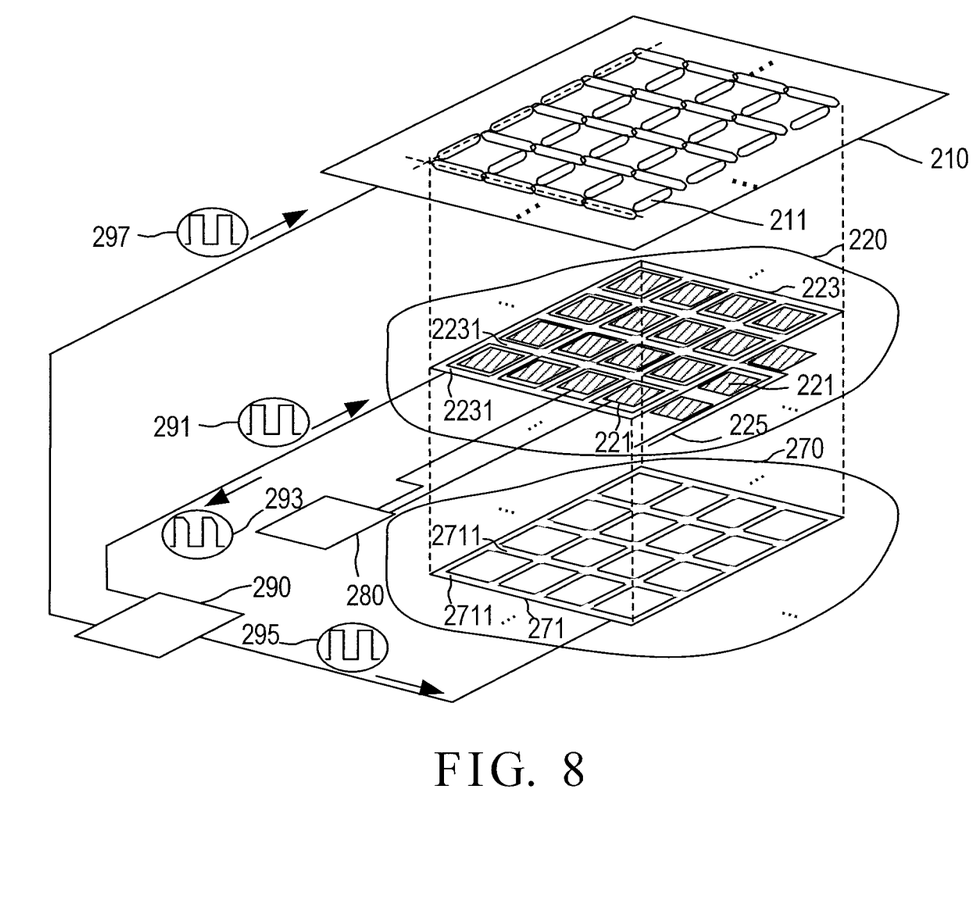
FIG. 8 is a schematic diagram of the display pixel electrode and touch sensing electrode layer and the first reflection shielding electrode layer in accordance with a third example of the present invention.

FIG. 8 is a schematic diagram of the display pixel electrode and touch sensing electrode layer 220 and the first reflection shielding electrode layer 270 in accordance with a still another example of the present invention. As shown, the OLED display panel with touch sensing electrodes 200 further includes a display driving circuit 280 and a self-capacitance touch detection circuit 290. In a touch detection period, the self-capacitance touch detection circuit 290 sequentially or randomly outputs a touch detection signal 291 to a selected touch sensing electrode 223 and reads a touch sensing signal 293 form the selected touch sensing electrode 223.

At the same time, the self-capacitance touch detection circuit 290 also outputs a reflection shielding signal 295 to the at least one reflection shielding electrode 271 corresponding to the selected touch sensing electrode 223. The shape of the touch detection signal 291 and the reflection shielding signal 295 may be the square wave, sine wave, triangle wave, and so on.

Figure 9A:
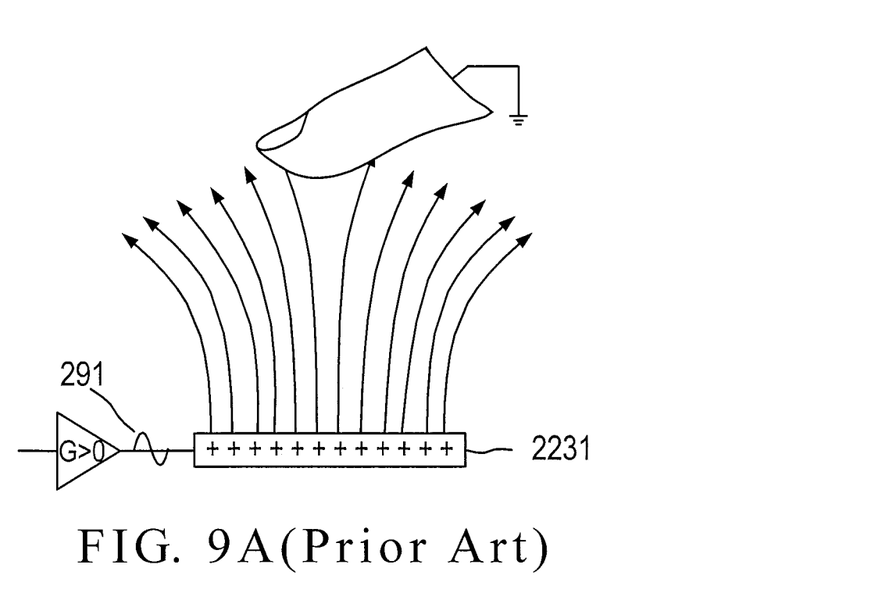
FIG. 9A is a schematic diagram of touch operation principle of prior art.
Figure 9B:
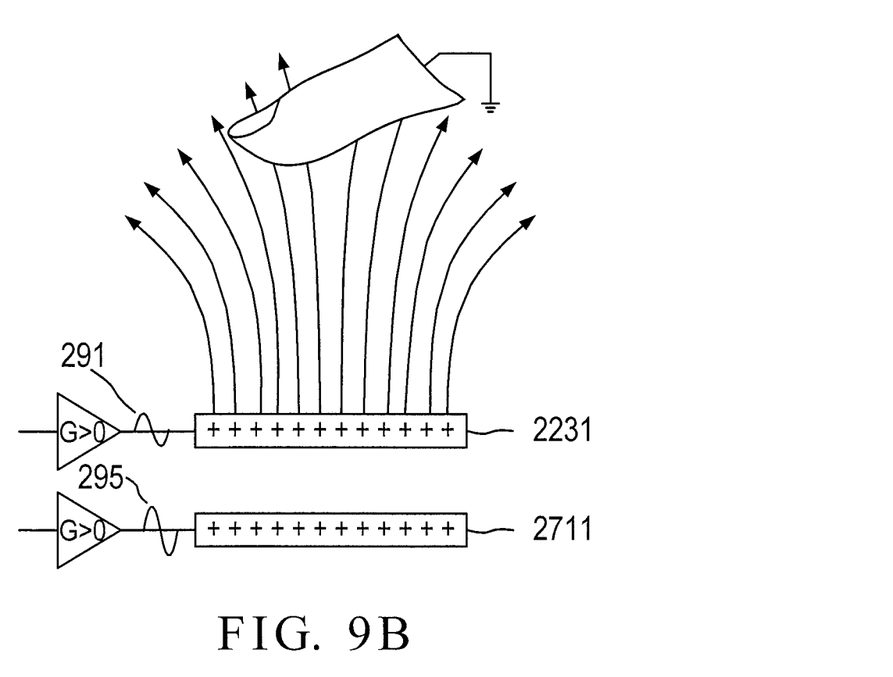
FIG. 9B is a schematic diagram of touch operation principle of the first reflection shielding electrode layer in accordance with an example of the present invention.

FIG. 9A is a schematic diagram of touch operation principle of prior art, and FIG. 9B is a schematic diagram of touch operation principle of the first reflection shielding electrode layer 270 in accordance with an example of the present invention. As shown in FIG. 9A, when the conductor lines 2231 of the touch sensing electrodes 223 are applied with the touch detection signal 291, the electric flux lines will emit from the conductor lines 2231. When a finger is in the proximity of a touch display panel, the number of the electric flux lines will be reduced owing to the grounding effect of the finger.

As shown in FIG. 9B, when the conductor lines 2231 of the touch sensing electrodes 223 are applied with the touch detection signal 291 and the conductor lines 2711 are applied with the reflection shielding signal 295, owing to the phase of the reflection shielding signal 295 being the same with the phase of the touch detection signal 291, the electric flux lines emitting from the touch sensing electrodes 223 (or the conductor lines 2231) will be pushed higher than those in FIG. 9A by the electric field of the at least one reflection shielding electrode 271 (or the conductor lines 2711) in the present invention. Lots of the electric flux lines will be grounded by the finger. The number of the electric flux lines will be reduced in comparison with that of in FIG. 9A. Therefore, the capacitance change in FIG. 9B is much larger than that in FIG. 9A. It can accurately and easily detect the finger touch.

In another example, the phase of the reflection shielding signal 295 is the same with the phase of the touch detection signal 291 and the voltage level of the reflection shielding signal 295 is greater than or equal to the voltage level of the touch detection signal 291. When the voltage level of the reflection shielding signal 295 is greater than the voltage level of the touch detection signal 291, the electric flux lines will be pushed much higher by the electric field of the conductor lines 2711.

As shown in FIG. 8, in the touch detection period, the self-capacitance touch detection circuit 290 outputs a capacitance cancellation signal 297 to the common electrode layer 210, wherein a phase of the capacitance cancellation signal 297 is the same as a phase of the touch detection signal 291.

In an embodiment of the present invention, the voltage level of the common electrode layer 210 is the same with the voltage level of the touch sensing electrode 223. Because the phase and the voltage level of the capacitance cancellation signal 297 are respectively identical to the phase and the voltage level of the touch detection signal 291, there is no capacitance between the common electrode layer 210 and the touch sensing electrode 223. The capacitance cancellation signal 297 can eliminate the capacitance between the common electrode layer 210 and the touch sensing electrode 223.

Figure 10:
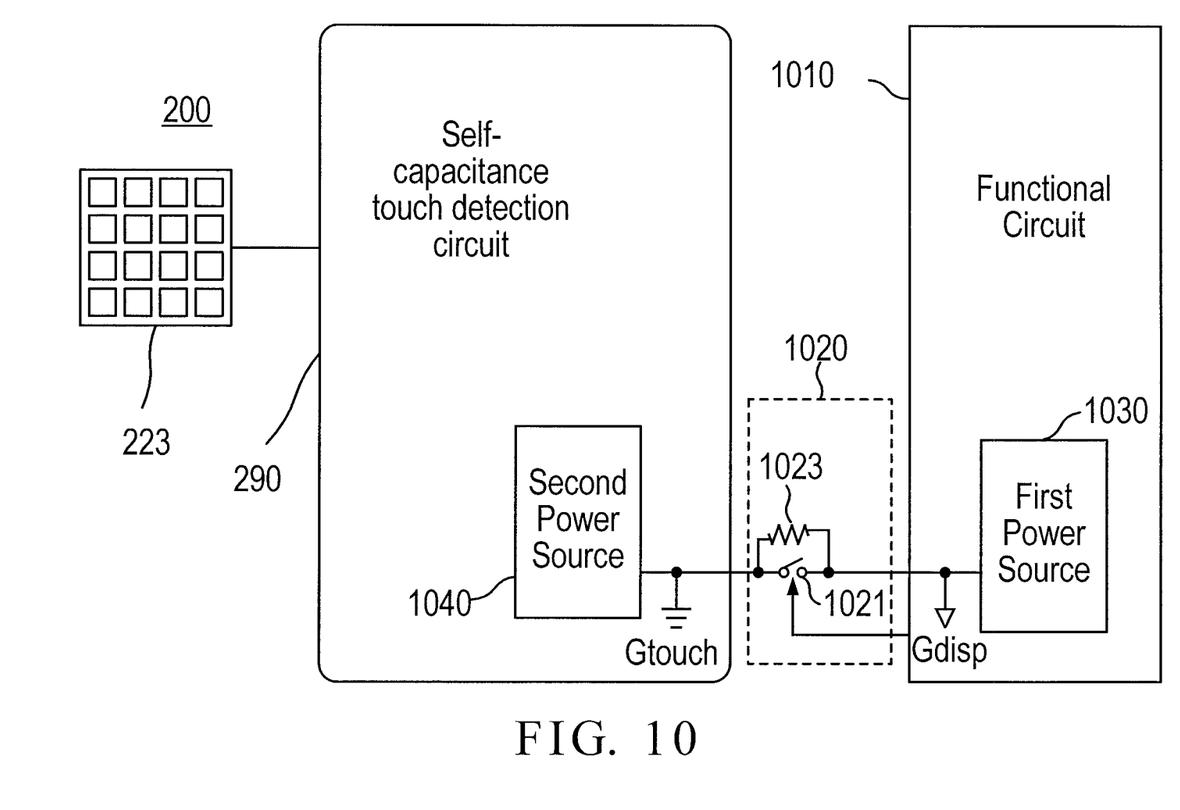
FIG. 10 is a schematic diagram of an OLED display panel with touch sensing electrodes powered by dedicated power source in accordance with an embodiment of the present invention.

FIG. 10 is a schematic diagram of an OLED display panel with touch sensing electrodes 200 powered by dedicated power source in accordance with an embodiment of the present invention. As shown in FIG. 10, the OLED display panel with touch sensing electrodes 200 includes a functional circuit 1010, a plurality of touch sensing electrodes 223, a self-capacitance touch detection circuit 290, and a switch device 1020. The switch device 1020 can be a switch element 1021 capable of switching its two terminals to be connected or disconnected. Alternatively, the switch device 1020 may include the switch element 1021 and a high impedance element 1023 connected to the two terminals of the switch element 1021. In this embodiment, the switch device 1020 includes the switch element 1021 and the high-impedance element 1023 connected to the two terminals of the switching element 1021.

The functional circuit 1010 is a circuit to provide specific functions of the OLED display panel with touch sensing electrodes 200 and is powered by a first power source 1030. The functional circuit 1010 and the first power source 1030 have a first grounding terminal referring to a first ground (Gdisp). In one embodiment of the present invention, the functional circuit 1010 can be a display control circuit connected to the common electrode layer 210, thin film transistor layer 250, and so on, for controlling a display unit to display an image.

The self-capacitance touch detection circuit 290 is provided for sensing the touch of an object such as a finger. In FIG. 10, only one touch sensing electrode 223 is shown. However, in practical application, there are a plurality of touch sensing electrodes 223 arranged on the display pixel electrode and touch sensing electrode layer 220 in the first direction and the second direction.

The self-capacitance touch detection circuit 290 is powered by a second power source 1040 which is different from the first power source 1030. The self-capacitance touch detection circuit 290 and the second power source 1040 have a second grounding terminal referring to a second ground (Gtouch). The self-capacitance touch detection circuit 290 is connected to the plurality of touch sensing electrodes 223 for driving the touch sensing electrodes 223 to perform touch sensing. During an operation of touch sensing, there is no common current loop existed between the first power source 1030 and the second power source 1040 or there is a current loop formed through a high impedance element. Optionally, the self-capacitance touch detection circuit 290, the second power source 1040 and the switch element 1020 are implemented in an integrated circuit chip. In another embodiment of the present invention, the self-capacitance touch detection circuit 290, the second power source 1040 and the switch element 1020 can be individual components which are mounted on a print circuit board (PCB) and are electrically connected by the traces on the PCB.

The switch device 1020 is connected between the grounding terminal of the first power source 1030 and the grounding terminal of the second power source 1040 for controlling the grounding terminal of the first power source 1030 and the grounding terminal of the second power source 1040 to be connected or disconnected. Namely, during the operation of the touch sensing, the first power source 1030 and the second power source 1040 are disconnected, and thus there is no common current loop. During the operation exclusive of touch sensing, the first power source 1030 and the second power source 1040 are connected, so as to have a common current loop.

The switch device 1020 includes at least one switch element 1021, which is preferably a transistor switch element. The switch device 1020 may further include a high impedance element 1023. The high impedance element 1023 is connected to the switch element 1021 in parallel for preventing an electrostatic voltage difference from being generated between the functional circuit 1010 and the self-capacitance touch detection circuit 290. The high impedance element 1023 is a resistor with a resistance greater than 1 MΩ. The functional circuit 1010 controls the switch element 1021 to be on or off. In other embodiments, the self-capacitance touch detection circuit 290 is employed to control the switch element 1021 to be on or off.

Figure 11:
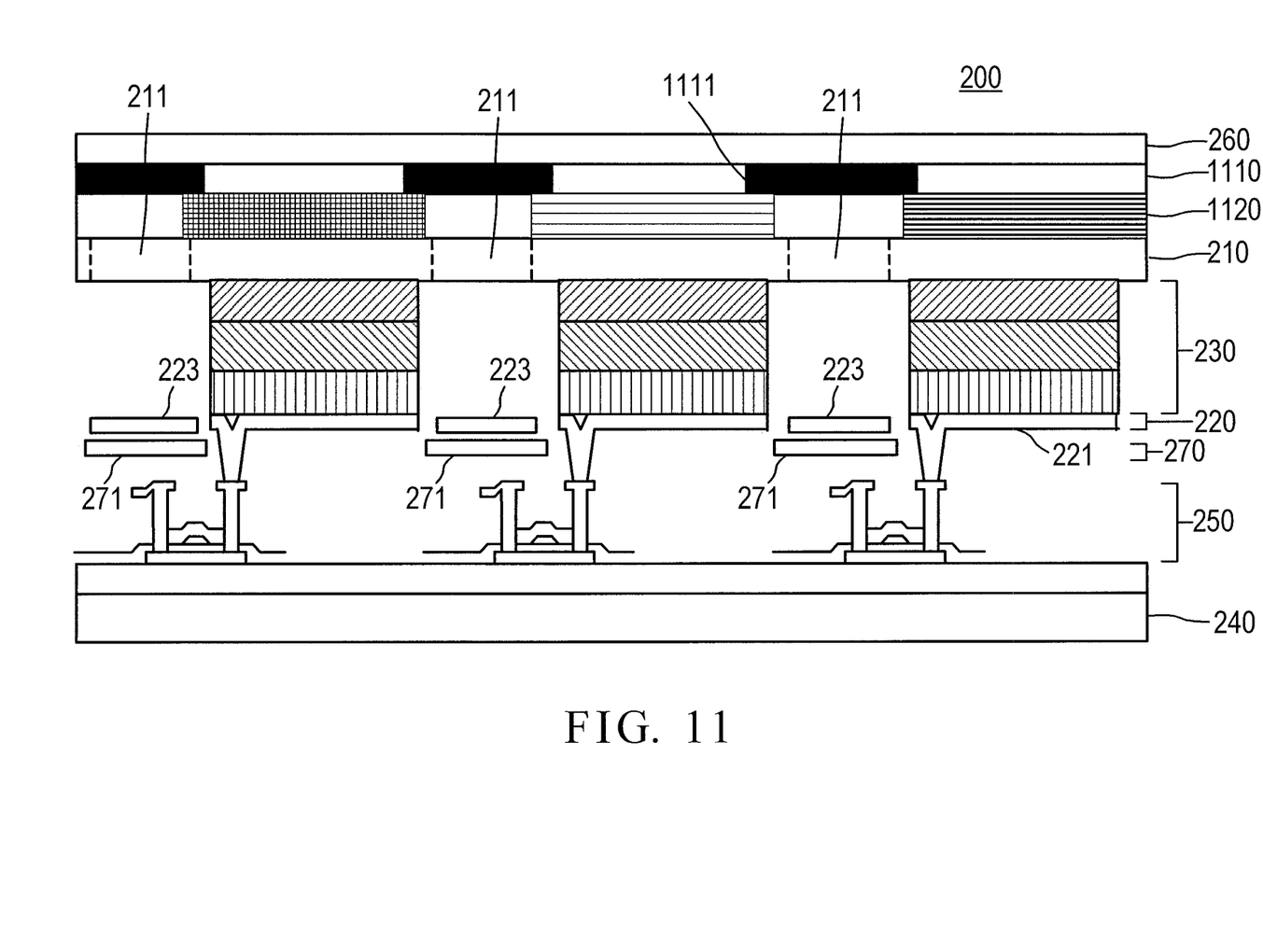
FIG. 11 is a second stackup diagram of the OLED display panel with touch sensing electrodes in accordance with the present invention.

FIG. 11 is another stackup diagram of the OLED display panel with touch sensing electrodes in accordance with the present invention. As shown, the OLED display panel with touch sensing electrodes 200 of FIG. 11 is similar to that of FIG. 2 except that it further includes a black matrix layer 1110 and a color filter layer 1120.

The black matrix layer 1110 is disposed at one side of the encapsulation layer 260 facing the display pixel electrode and touch sensing electrode layer 220. The color filter layer 1120 is disposed at one side of the black matrix layer 1110 facing the display pixel electrode and touch sensing electrode layer 220.

The black matrix layer 1110 is composed of a plurality of opaque lines 1111 that are black and opaque. The plurality of opaque lines 1111 are arranged as a checkerboard pattern, and the conductor lines 2231 are disposed at the positions corresponding to positions of the opaque lines 1111. The color filters of the color filter layer 1120 are disposed at the spaces among those opaque lines 1111 of the black matrix layer 1110.

Figure 12:
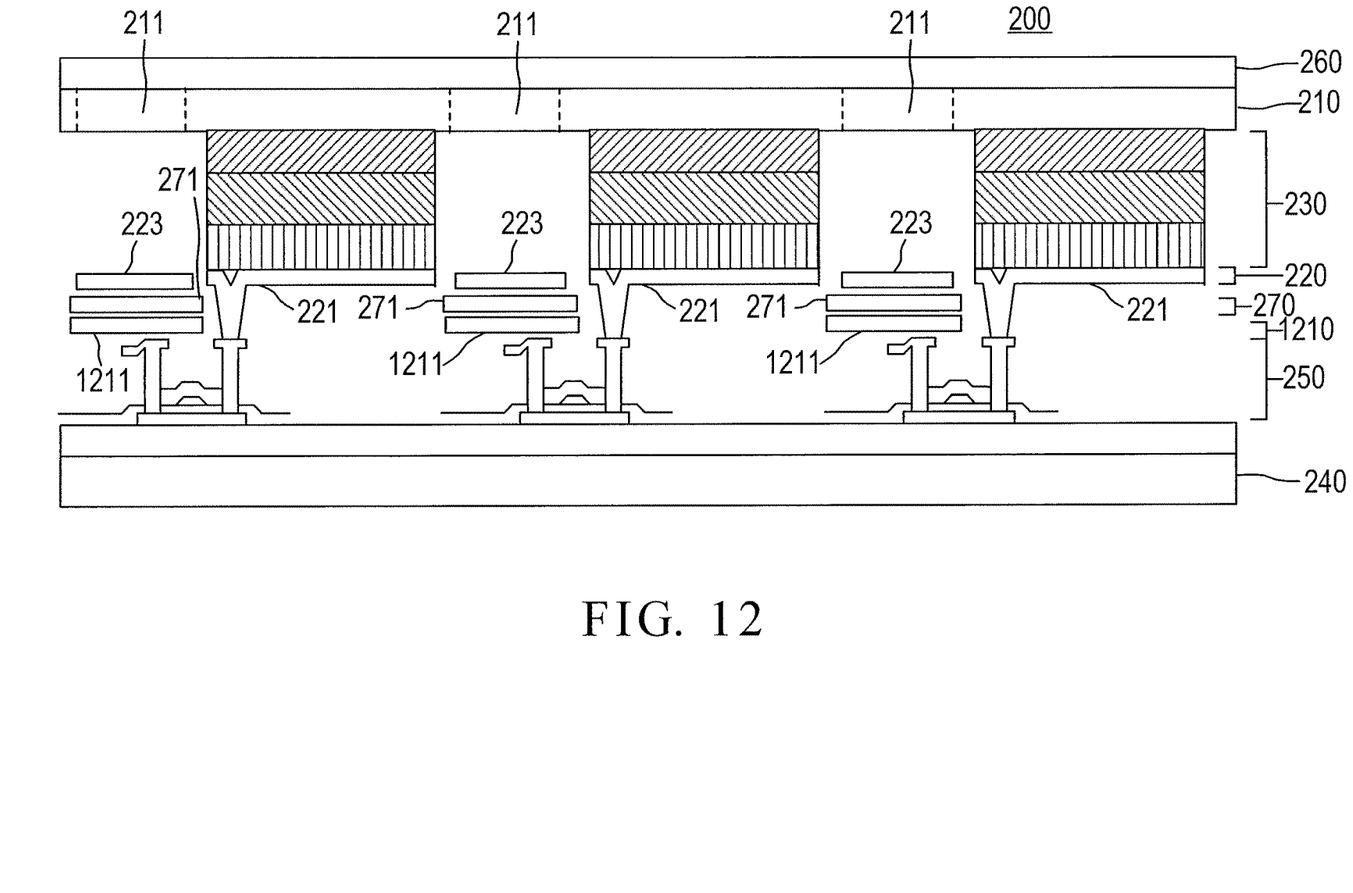
FIG. 12 is a third stackup diagram of the OLED display panel with touch sensing electrodes in accordance with the present invention.

FIG. 12 is still another stackup diagram of the OLED display panel with touch sensing electrodes in accordance with the present invention. As shown, the OLED display panel with touch sensing electrodes 200 of FIG. 12 is similar to that of FIG. 2 except that it further includes a second reflection shielding electrode layer 1210 disposed at the other side of the first reflection shielding electrode layer 270 facing the display pixel electrode and touch sensing electrode layer 220, and the second reflection shielding electrode layer 1210 has at least one second reflection shielding electrode 1211. The at least one second reflection shielding electrode 1211 has a mesh type pattern and is disposed at a position corresponding to a position of a touch sensing electrode 223. In another example, the at least one second reflection shielding electrode 1211 may have rectangle type pattern or may occupy the whole second reflection shielding electrode layer 1210. In a touch detection period, the self-capacitance touch detection circuit 290 also outputs a second reflection shielding signal to the at least one second reflection shielding electrode 1211 corresponding to the selected touch sensing electrode 223. The phase of the second reflection shielding signal is the same with the phase of the touch detection signal 291, and thus the electric flux lines will be pushed much higher by the electric field of the at least one second reflection shielding electrode 1211.

Figure 13:
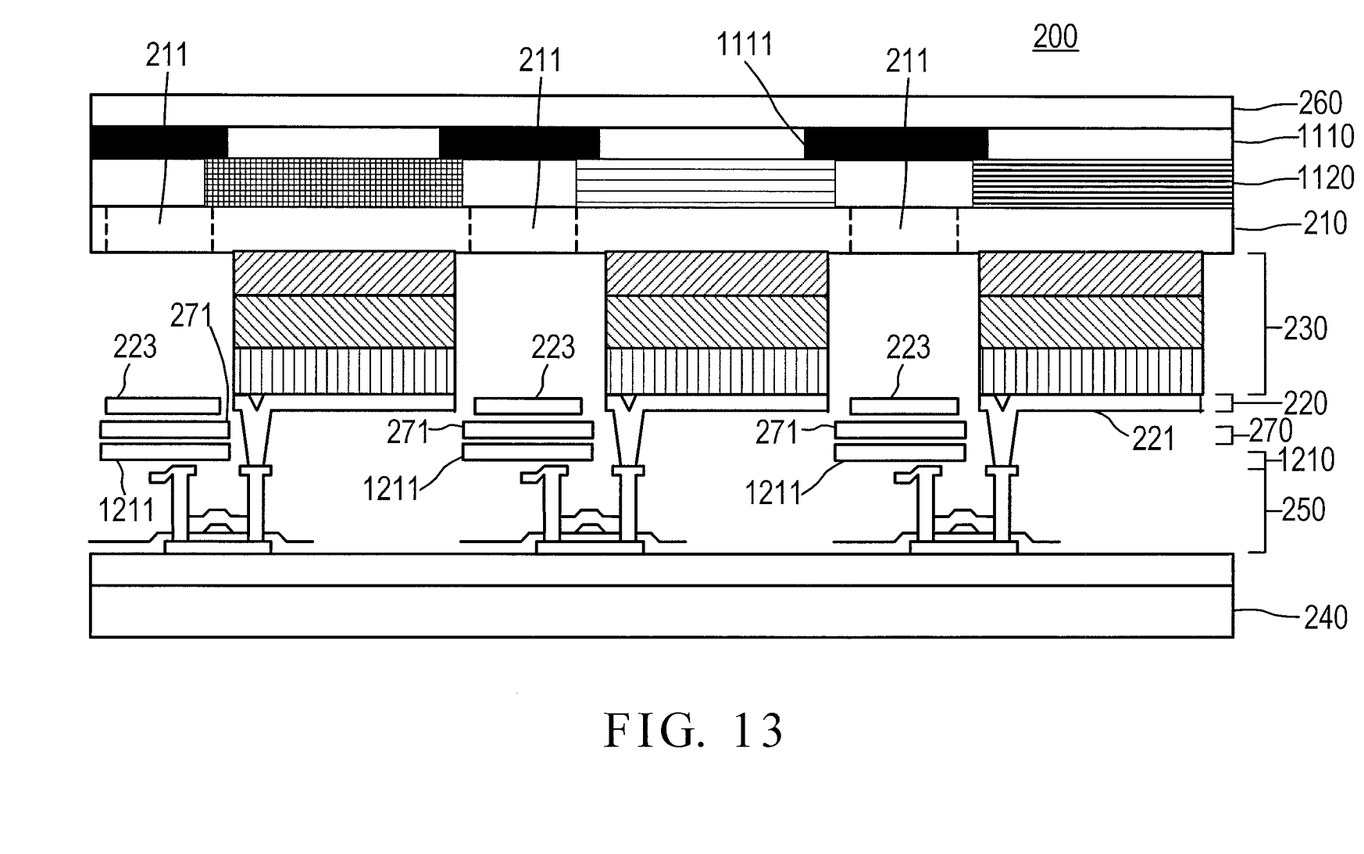
FIG. 13 is a fourth stackup diagram of the OLED display panel with touch sensing electrodes in accordance with the present invention.

FIG. 13 is yet another stackup diagram of the OLED display panel with touch sensing electrodes in accordance with the present invention. As shown, the OLED display panel with touch sensing electrodes 200 of FIG. 13 is similar to that of FIG. 12 except that it further includes a black matrix layer 1110 and a color filter layer 1120.

In view of the foregoing, it is known that, in the prior design, the common electrode layer 210 will shield the electric flux lines emitting from the touch sensing electrodes. With the existence of the common electrode layer 210 in the OLED display panel, it is hard to implement in-cell touch sensor electrode. However, in the present invention, with the through holes 211 in the common electrode layer 210, the electric flux lines can penetrate the through holes 211 and reach the surface of the OLED display panel, so that the self-capacitance touch detection circuit 290 can detect the capacitance change of the finger touch or approaching. Moreover, with the help of the reflection shielding signal of the present invention, the electric flux lines emitting from the touch sensing electrodes can be pushed higher than ever by the electric field of the at least one reflection shielding electrode in the present invention. Therefore, it can accurately and easily detect the finger touch or approaching. Furthermore, for increasing the accuracy of touch detection, it can also use the second reflection shielding electrode layer 1210 to further push the electric flux lines higher.

Although the present invention has been explained in relation to its preferred embodiment, it is to be understood that many other possible modifications and variations can be made without departing from the spirit and scope of the invention as hereinafter claimed.

What is claimed is:

1. An OLED display panel with touch sensing electrodes, comprising:
   a common electrode layer having a plurality of through holes defined therein;
   a display pixel electrode and touch sensing electrode layer including a plurality of display pixel electrodes and a plurality of touch sensing electrodes, wherein each touch sensing electrode has a mesh type pattern;
   an OLED layer configured between the common electrode layer and the display pixel electrode and touch sensing electrode layer;
   a lower substrate;
   a thin film transistor layer disposed at one side of the lower substrate facing the OLED layer; and
   an encapsulation layer disposed at the other side of the common electrode layer facing the OLED layer,
   wherein a first power circuit for the touch sensing electrodes is independent to a second power circuit for the OLED display panel.

2. The OLED display panel with touch sensing electrodes as claimed in claim 1, further comprising:
   a first reflection shielding electrode layer configured between the display pixel electrode and touch sensing electrode layer and the lower substrate, the first reflection shielding electrode layer having at least one reflection shielding electrode.

3. The OLED display panel with touch sensing electrodes as claimed in claim 2, wherein the at least one reflection shielding electrode has a mesh type pattern and is disposed at a position corresponding to a position of a touch sensing electrode.

4. The OLED display panel with touch sensing electrodes as claimed in claim 2, wherein the first reflection shielding electrode layer is made of transparent conductive material or opaque conductive material.

5. The OLED display panel with touch sensing electrodes as claimed in claim 2, further comprising:
a second reflection shielding electrode layer disposed at the other side of the first reflection shielding electrode layer facing the display pixel electrode and touch sensing electrode layer.

6. The OLED display panel with touch sensing electrodes as claimed in claim 1, wherein the common electrode layer is a cathode layer and the display pixel electrode is an anode display pixel electrode, or the common electrode layer is an anode layer and the display pixel electrode is a cathode display pixel electrode.

7. The OLED display panel with touch sensing electrodes as claimed in claim 1, wherein the through holes are disposed at positions corresponding to positions of the touch sensing electrodes.

8. The OLED display panel with touch sensing electrodes as claimed in claim 1, wherein the common electrode layer is a transparent silver film with a thickness smaller than 50 nanometers.

9. The OLED display panel with touch sensing electrodes as claimed in claim 1, wherein the display pixel electrode and touch sensing electrode layer is a transparent conductive layer made of transparent metal selected from the group consisting of ITO, ZTO, IZO, conductive polymer, carbon nanotube, graphene, and silver film with a thickness smaller than 50 nanometers.

10. The OLED display panel with touch sensing electrodes as claimed in claim 1, further comprising a black matrix layer and a color filter layer.

11. The OLED display panel with touch sensing electrodes as claimed in claim 1, further comprising a display driving circuit and a self-capacitance touch detection circuit so that, in a touch detection period, the self-capacitance touch detection circuit sequentially or randomly outputs a touch detection signal to a selected touch sensing electrode and reads a touch sensing signal from the selected touch sensing electrode.

12. The OLED display panel with touch sensing electrodes as claimed in claim 11, wherein the self-capacitance touch detection circuit outputs a reflection shielding signal to the at least one reflection shielding electrode corresponding to the selected touch sensing electrode.

13. The OLED display panel with touch sensing electrodes as claimed in claim 12, wherein the reflection shielding signal is a DC-level signal, a zero voltage signal, or a signal with a phase which is same as a phase of the touch detection signal.

14. The OLED display panel with touch sensing electrodes as claimed in claim 11, wherein, in the touch detection period, the self-capacitance touch detection circuit outputs a capacitance cancellation signal to the common electrode layer.

15. The OLED display panel with touch sensing electrodes as claimed in claim 14, wherein a phase of the capacitance cancellation signal is same as a phase of the touch detection signal.

16. The OLED display panel with touch sensing electrodes as claimed in claim 14, wherein, in the touch detection period, there is no current loop between the power circuit of the touch sensing electrodes and the power circuit of the OLED display panel.

* * * * *